(12) United States Patent
Suguro

(10) Patent No.: US 7,709,363 B2
(45) Date of Patent: May 4, 2010

(54) METHOD FOR MANUFACTURING SEMICONDUCTOR DEVICE

(75) Inventor: Kyoichi Suguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 160 days.

(21) Appl. No.: 12/125,497

(22) Filed: May 22, 2008

(65) Prior Publication Data

US 2008/0293225 A1 Nov. 27, 2008

(30) Foreign Application Priority Data

May 23, 2007 (JP) ............... 2007-136885

(51) Int. Cl.
*H01L 21/425* (2006.01)
(52) U.S. Cl. .................. 438/514; 438/197; 438/199; 438/207; 438/510; 257/336; 257/347; 257/369; 257/371; 257/E21.255; 257/E21.257
(58) Field of Classification Search ............... 438/228, 438/513

See application file for complete search history.

(56) References Cited

U.S. PATENT DOCUMENTS

| | | | | |
|---|---|---|---|---|
| 5,132,241 A | * | 7/1992 | Su | ............... 438/228 |
| 5,763,302 A | | 6/1998 | Kapoor | |
| 5,770,492 A | | 6/1998 | Kapoor | |
| 2005/0233257 A1 | * | 10/2005 | Latchford et al. | ........... 430/311 |

FOREIGN PATENT DOCUMENTS

| | | |
|---|---|---|
| JP | 2-244629 | 9/1990 |
| JP | 4-92416 | 3/1992 |
| JP | 5-82743 | 4/1993 |
| JP | 6-260607 | 9/1994 |
| JP | 2003-158194 | 5/2003 |
| JP | 2005-322872 | 11/2005 |
| JP | 2007-19206 | 1/2007 |
| JP | 2007-59812 | 3/2007 |

OTHER PUBLICATIONS

Notice of Reasons for Rejection mailed by the Japanese Patent Office on Aug. 18, 2009, for Japanese Patent Application No. 2007-136885.

* cited by examiner

*Primary Examiner*—N Drew Richards
*Assistant Examiner*—Kyoung Lee
(74) *Attorney, Agent, or Firm*—Finnegan, Henderson, Farabow, Garrett & Dunner, L.L.P.

(57) ABSTRACT

A method for manufacturing a semiconductor device including a first conductive type impurity region formed by introducing a first conductive type impurities in a first region of a semiconductor region and heating the first region, a second conductive type impurity region formed by introducing a second conductive type impurities in a second region of the semiconductor region and heating the second region, the method including covering the second region with a mask and then introducing the first conductive type impurities in a surface of the first region, removing the mask by a process using gas including oxygen while forming an oxide film on the surface of the first region by the processing using the gas including the oxygen, and introducing the second conductive type impurities in a surface of the second region by using the oxide film as a mask.

18 Claims, 10 Drawing Sheets

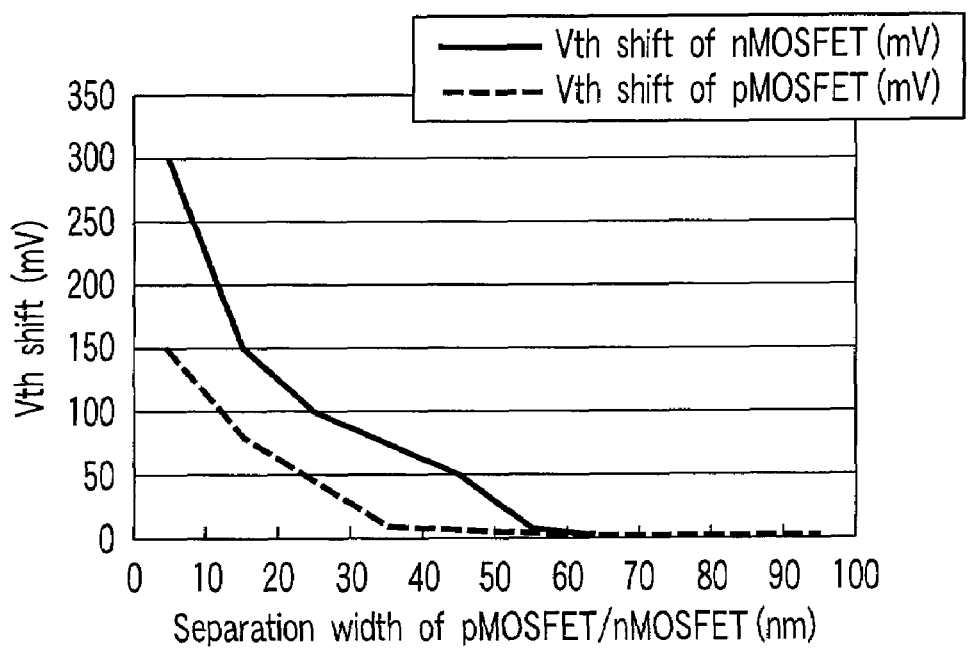
F I G. 13
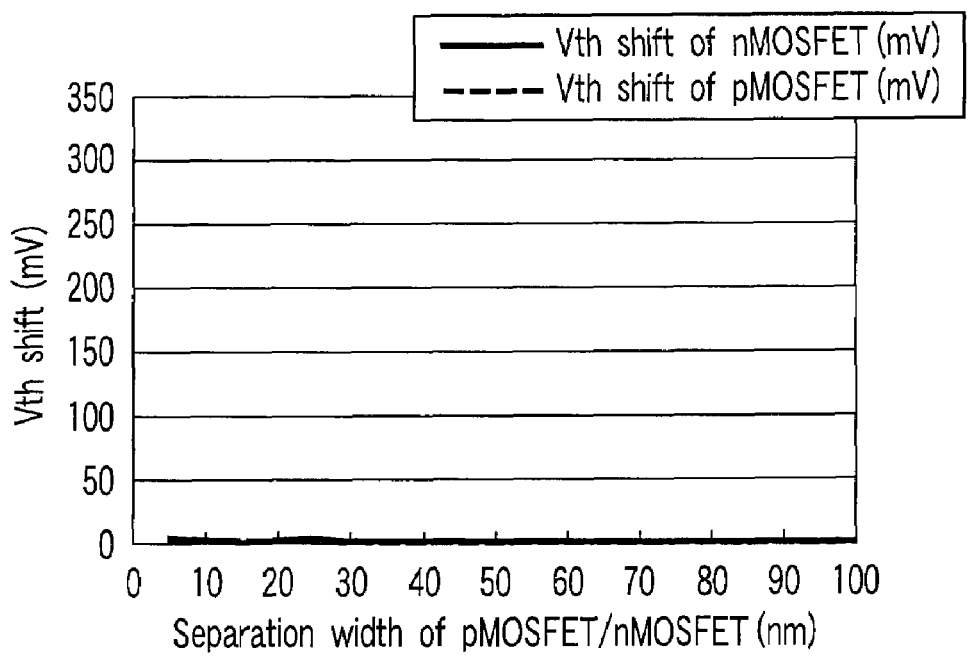
F I G. 14

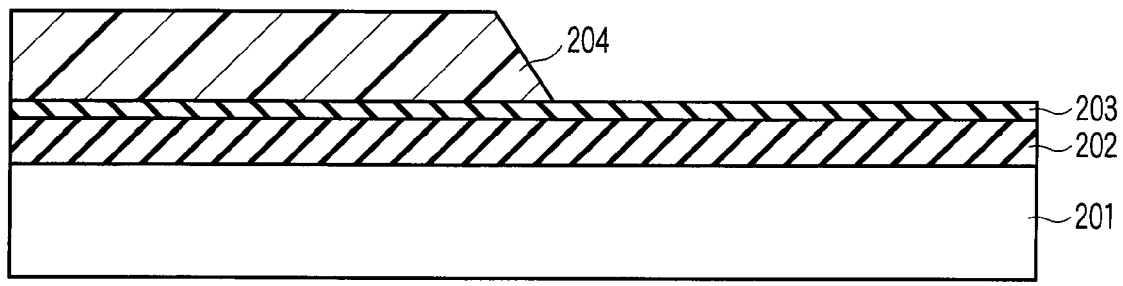
F I G. 20
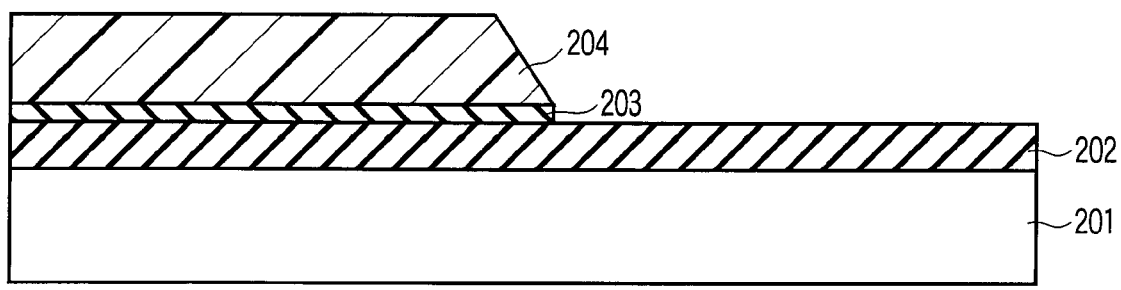
F I G. 21
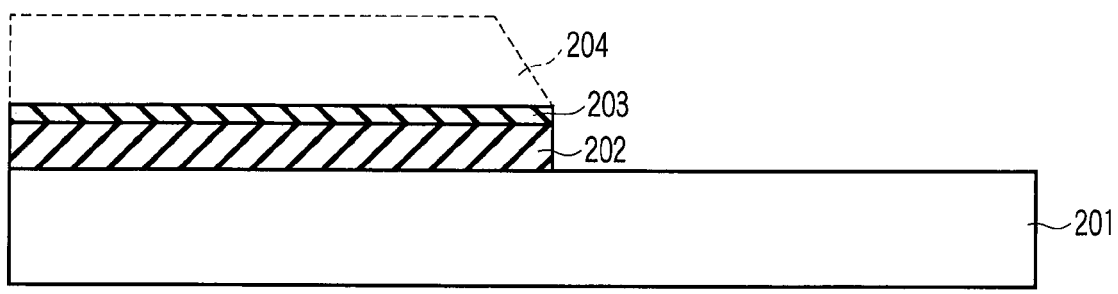
F I G. 22

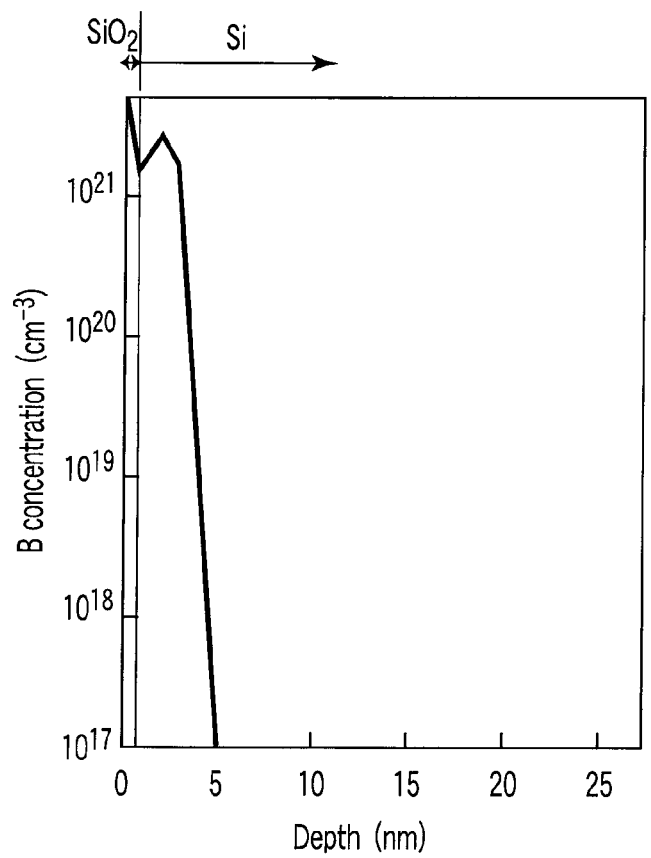
F I G. 26A
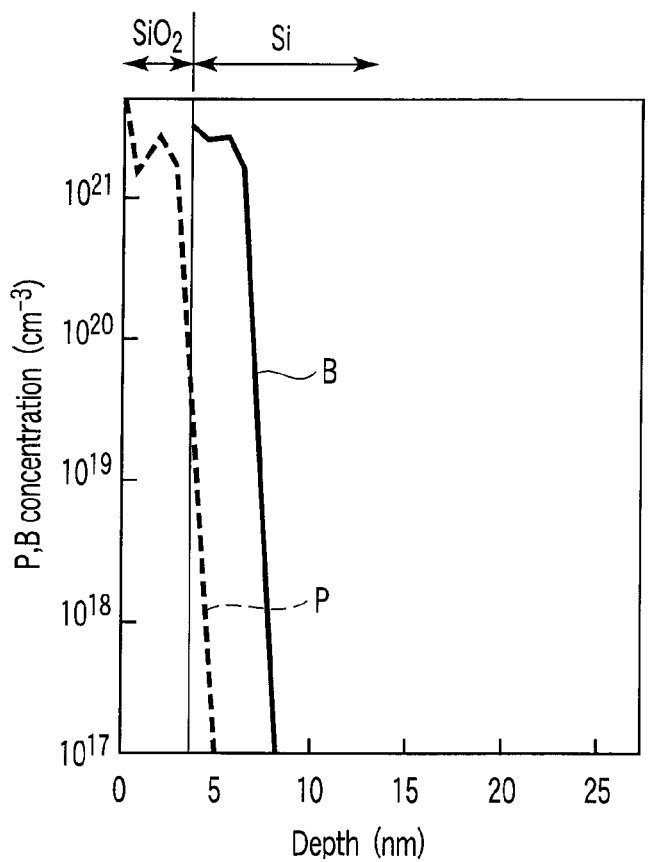
F I G. 26B

METHOD FOR MANUFACTURING SEMICONDUCTOR DEVICE

CROSS-REFERENCE TO RELATED APPLICATIONS

This application is based upon and claims the benefit of priority from prior Japanese Patent Application No. 2007-136885, filed May 23, 2007, the entire contents of which are incorporated herein by reference.

BACKGROUND OF THE INVENTION

1. Field of the Invention

The present invention relates to a method for manufacturing a semiconductor device comprising forming n-type and p-type impurity regions in a semiconductor region.

2. Description of Related Art

A manufacturing process of CMOSFET includes a step of doping n-type impurities into a polycrystalline silicon film to be process into a gate electrode and a step of doping p-type impurities into the polycrystalline silicon film, wherein the n-type impurities are doped into an nMOS forming region of the polycrystalline silicon film and the p-type impurities are doped into a pMOS forming region of the polycrystalline silicon film (Jpn. Pat. Appln. KOKAI Publication No. H02-244629).

However, a joint portion of the nMOS forming region and the pMOS forming region, that is, a portion into which the n-type impurities and the p-type impurities are doped, has been needed to be taken into consideration along with the miniaturization of device. This problem appears more seriously in SRAM highly miniaturized.

The above problem will be explained concretely using FIGS. 16 to 19. FIGS. 16 to 19 are cross-sectional views of a gate process of conventional CMOSFET.

[FIG. 16]

An undoped polycrystalline silicon film 91 to be processed into a gate electrode is formed on an nMOS forming region and a pMOS forming region. The thickness of the polycrystalline silicon film 91 is 100 nm or greater. The polycrystalline silicon film 91 of the pMOS forming region is covered with a first photoresist mask 92. The thickness of the first photoresist mask 92 is 300 nm or greater (typically 600 nm or greater). N-type impurities (here, phosphorus ions) 93 are implanted into the polycrystalline silicon film 91 into the nMOS forming region by ion implantation process using the first photoresist mask 92 as a mask. As a result, an n-type impurities introduced region 94 is formed on a surface of the polycrystalline silicon film 91. The ion implantation process is carried out under conditions that acceleration energy is in a range of 5 to 10 keV, and a dose amount is $3\text{-}8\times10^{15}$ cm$^{-2}$.

[FIG. 17]

The first photoresist mask 92 is removed by using oxygen plasma ashing, and a liquid mixture of sulfuric acid and hydrogen peroxide solution. The polycrystalline silicon film 91 in the nMOS forming region is covered with a second photoresist mask 95. At that time, misalignment of mask is occurred in lithography step, and displacement between the second photoresist mask 95 and the n-type impurity introduced region 94 is occurred. Typically, the thickness of the second photoresist mask 95 is also 300 nm or greater. If the film thickness is thick, a taper is formed at the pattern edge of a photoresist film which has undergone baking process performed after the exposure process in the lithography step. In the ion implantation step after the lithography step, the taper causes the incident ion distribution to disperse under the photoresist mask 95. FIG. 17 shows a state where the second photoresist mask 95 is shifted rightward. As a result, a surface of left edge 96 of the n-type impurity introduced region 94 is exposed. The cause for the displacement of the second photoresist mask 95 is the misalignment of mask which occurred at the time of exposure performed to the underlying pattern of the semiconductor substrate through a glass mask.

[FIG. 18]

P-type impurities (here, boron ions) 97 are implanted into the polycrystalline silicon film 91 in the pMOS forming region by ion implantation process using the second photoresist mask 95 as a mask. As a result, a p-type impurities introduced region 98 is formed on a surface of the polycrystalline silicon film 91. The ion implantation process is carried out under the conditions that acceleration energy is 2 keV, and a dose amount is $5\times10^{15}$ cm$^{-2}$. At that time, since the second photoresist mask 95 is formed such that it is shifted rightward, an n-type and p-type impurities introduced region 99 of high impurity density ($>1\times10^{19}$ cm$^{-3}$) including phosphorus and boron is formed between the n-type impurities introduced region 94 and the p-type impurities introduced region 98. Typically, the width of the n-type and p-type impurities introduced region 99 is 50 nm or greater.

[FIG. 19]

The second photoresist mask 95 is removed. Phosphorus and boron in the polycrystalline silicon film 91 are diffused by thermal treatment of 1000° C. or higher, and the phosphorus and boron are activated. As a result, three impurity regions, i.e., n-type impurity region 94', p-type impurity region 98', and the n-type and p-type impurity region 99' are formed in the polycrystalline silicon film 91, then the undoped region in the polycrystalline silicon film 91 disappears.

Here, since the width of the n-type and p-type impurity region 99' is 50 nm or more, it becomes difficult to control a threshold voltage of CMOSFET along with the miniaturization.

To reduce the width of the n-type and p-type impurity region 99', mask alignment of higher precision is required. For this purpose, it is necessary to enhance the alignment precision of the exposure apparatus. However, much cost is required to develop an exposure apparatus having high alignment precision and thus, cost is increased at the manufacturing stage of devices.

To solve the above problem, there is a method in which a region where n-type impurities 93 are implanted and a region where p-type impurities 97 are implanted are deviated on a mask design so that the n-type impurity introduced region 94 and the p-type impurity introduced region 98 are not superposed on each other. However, this method has a problem that CAD correction work increases in a case of small lot production of many products such as SoC (System on Chip) because circuit pattern differs for each of products. Further, in some cases, it is very difficult to change the design, and a problem that the method cannot cope with the design occurs.

BRIEF SUMMARY OF THE INVENTION

According to an aspect of the present invention, there is provided a method for manufacturing a semiconductor device comprising a first conductive type impurity region formed by introducing a first conductive type impurities in a first region of a semiconductor region, and a second conductive type impurity region formed by introducing a second conductive type impurities in a second region of the semiconductor region, the method comprising: covering the second region with a mask and then introducing the first conductive type impurities in a surface of the first region; removing the mask by a process using gas including oxygen while forming an oxide film on the surface of the first region by the processing using the gas including the oxygen; and introducing the second conductive type impurities in a surface of the second region by using the oxide film as a mask.

BRIEF DESCRIPTION OF THE SEVERAL VIEWS OF THE DRAWING

FIG. 13 is a diagram showing a relationship between shift of threshold voltage Vth of CMOSFET manufactured using a conventional method and separation width between pMOSFET and nMOSFET;

FIG. 14 is a diagram showing a relation between shift of threshold voltage Vth of CMOSFET manufactured using the method of the embodiment and separation width between pMOSFET and nMOSFET;

FIG. 20 is a cross-sectional view for explaining a manufacturing method of another embodiment;

FIG. 21 is a cross-sectional view showing the manufacturing method of the another embodiment following FIG. 20;

FIG. 22 is a cross-sectional view showing the manufacturing method of the another embodiment following FIG. 21;

FIGS. 26A and 26B are impurity concentration profiles obtained by the another embodiment.

DETAILED DESCRIPTION OF THE INVENTION

Embodiments of the present invention will be explained below with reference to the drawings.

First Embodiment

Figure 1:
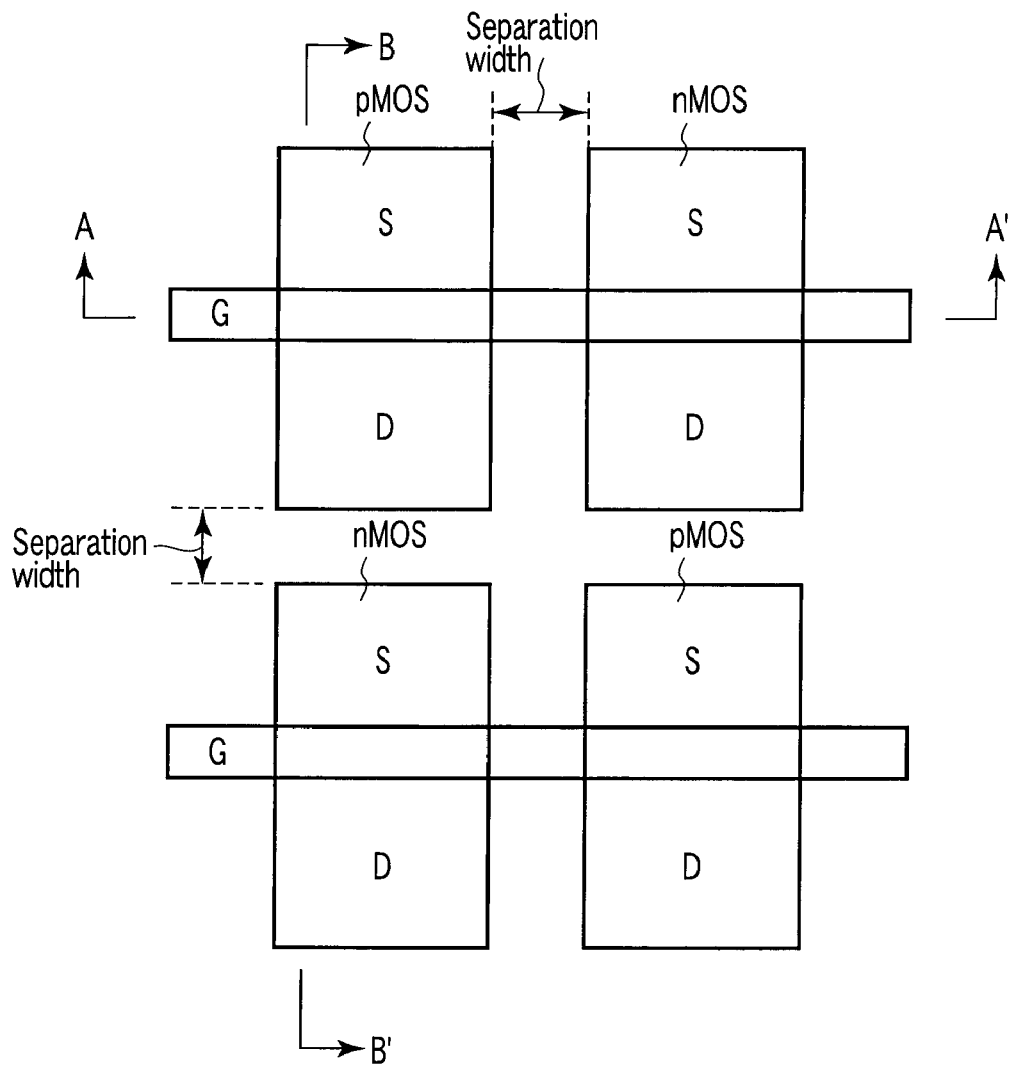
FIG. 1 is a plan view showing a CMOSFET constituting an SRAM according to an embodiment.

FIG. 1 is a plan view showing a CMOSFET constituting an SRAM according to an embodiment. A method for manufacturing the CMOSFET will be explained using FIGS. 2 to 12. FIGS. 2 to 8 are cross-sectional views taken along the line A-A' in FIG. 1, and FIGS. 9 to 12 are cross-sectional views taken along the line B-B' in FIG. 1.

[FIG. 2]

A p-well 2 and an n-well 3 are formed on a surface of a silicon substrate 1. The p-well 2 is formed in an nMOS forming region and the n-well 3 is formed in a pMOS forming region. An isolation region 4 is formed by STI process. The isolation region 4 is formed around an active area of n and p channel MOS transistors formed in the n and pMOS forming regions. A gate insulating film 5 is formed on the surface of the silicon substrate 1. Here, the gate insulating film 5 is formed also on the isolation region 4. An undoped polycrystalline silicon film 6 (semiconductor region) is formed on the gate insulating film 5. The polycrystalline silicon film 6 is to be processed into gate electrodes of n and p channel MOS transistors. The thickness of the polycrystalline silicon film 6 is, for example, 70 nm or less.

[FIG. 3]

A mask 7 which covers the polycrystalline silicon film 6 in the pMOS forming region is formed. The polycrystalline silicon film 6 in the nMOS forming region is not covered with the mask 7, and its surface is left exposed.

The mask 7 is made of film other than photoresist film. Examples of the films are a C (carbon) film, a polymer (high polymer formed of hydrocarbon polymer or carbon fluoride polymer) film, a polyimide (high polymer containing alkyl group, nitrogen and oxygen as main components) film, a silicon nitride film or a silicon oxide film.

These films can be removed by oxygen plasma ashing or plasma ashing of mixture gas of oxygen and other gas (including at least one of hydrogen, HF, $F_2$, $CF_4$, $SF_6$ and $NF_3$). Especially, the C film or the polyimide film can easily be removed by oxygen plasma ashing.

The plasma ashing includes an ashing by remote plasma in which the plasma is separated by 10 cm or more from a semiconductor substrate. The other gas may be diluted using nitrogen or inert gas such as He, Ne, Ar or Xe.

Here, a C film is used as the film, and the mask 7 having thickness of 200 nm or less is formed. For example, the mask 7 (C film) is formed by multilayer resist process using an SOG film and a photoresist mask formed thereon. The C film may be formed by any of a plasma CVD method, a sputtering method and a method in which organic material including C is applied and then, the organic solvent is vaporized by heating.

[FIG. 4]

The nMOS forming region and the pMOS forming region are irradiated with n-type impurities 8 by plasma doping or low acceleration ion implantation. At that time, since the polycrystalline silicon film 6 in the pMOS forming region is covered with the mask 7, the n-type impurities 8 are selectively introduced into the surface of the polycrystalline silicon film 6 of the nMos forming region (first region of the semiconductor region). As a result, the n-type impurity introduced region 9 is formed on the surface of the polycrystalline silicon film 6 in the nMOS forming region. Here, the n-type impurities 8 is P, As or Sb ions for example. The energy of the n-type impurities 8 is, for example, 1 keV or less, and the dose amount of the n-type impurities 8 is, for example, about $1-3 \times 10^{16}$ cm$^2$.

[FIG. 5]

The mask 7 is removed by oxygen plasma ashing. Here, since the C film is used as the mask 7, the mask 7 is easily removed.

The exposed surface of the n-type impurity introduced region 9 is oxidized by the oxygen plasma ashing when the mask 7 is removed, and then a silicon oxide thin film 10 as a mask is formed on the exposed surface in a self alignment manner. The thickness of the silicon oxide film 10 is 5 nm or less, and typically 2 to 3 nm. In addition, due the above oxygen plasma ashing, an extremely thin silicon oxide thin film (thickness: 1 nm or less) not shown is formed on the surface of the polycrystalline Si of the pMOS. In a case where the silicon oxide thin film hinders the introduction 12 of p-type impurities which is carried out in a subsequent step (FIG. 7), it is recommended to remove the silicon oxide thin film by diluted hydrofluoric acid treatment or dry treatment. Since the silicon oxide film (mask) 10 of nMOS is thicker than the silicon oxide thin film of the pMOS, the silicon oxide film (mask) 10 is not removed.

[FIG. 6]

The n-type impurities in the polycrystalline silicon film 6 in the nMOS forming region are diffused and activated by heating treatment of 600° C. or higher. As a result, an n-type impurity region 11 is formed over the entire polycrystalline silicon film 6 in the nMOS forming region. The silicon oxide thin film (thickness: 1 nm or less) may be removed by the step shown in FIG. 6 instead of the step shown in FIG. 5.

[FIG. 7]

The nMOS forming region and the pMOS forming region are irradiated with p-type impurities 12 by plasma doping or low acceleration ion implantation such that the depth of the impurity distribution becomes about 5 nm in the Si oxide film. At that time, since the nMOS forming region is covered with the silicon oxide film 10, the p-type impurities 12 are selectively introduced into a surface of the polycrystalline silicon film 6 (second region of the semiconductor region) of the pMOS forming region. As a result, a p-type impurity introduced region 13 is formed on the surface of the polycrystalline silicon film 6 in the pMOS forming region. Here, the p-type impurities 12 are B or Ga ions. The energy of the p-type impurities 12 are 1 keV or less (energy of B per atom is 100 eV or less, and energy of Ga is 1 keV or less), and a dose amount of p-type impurities 1 is about $1-3 \times 10^{16}$ cm$^{-2}$. Under such conditions, the silicon oxide film 10 covering the nMOS forming region functions as a mask.

[FIG. 8]

The silicon oxide film 10 is removed. The p-type impurities in the polycrystalline silicon film 6 are diffused by heating treatment of less than 1 second and 1000° C. or higher using a halogen lamp, a flash lamp or a laser, and the p-type impurities activated by the heating treatment. As a result, the p-type impurity region 14 is formed over the entire polycrystalline silicon film 6 in the pMOS forming region. At that time, the n-type and p-type impurity region 15 is also formed, but its width is 10 nm or less.

Thereafter, a CMOSFET is completed through known steps shown in FIGS. 9 to 14. The steps shown in FIGS. 9 to 14 will be explained briefly.

Figure 9:
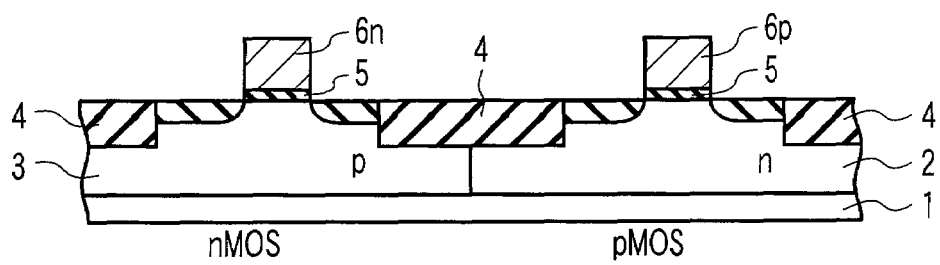
FIG. 9 is a cross-sectional view showing the method for manufacturing the CMOSFET of the embodiment following FIG. 8.
Figure 10:
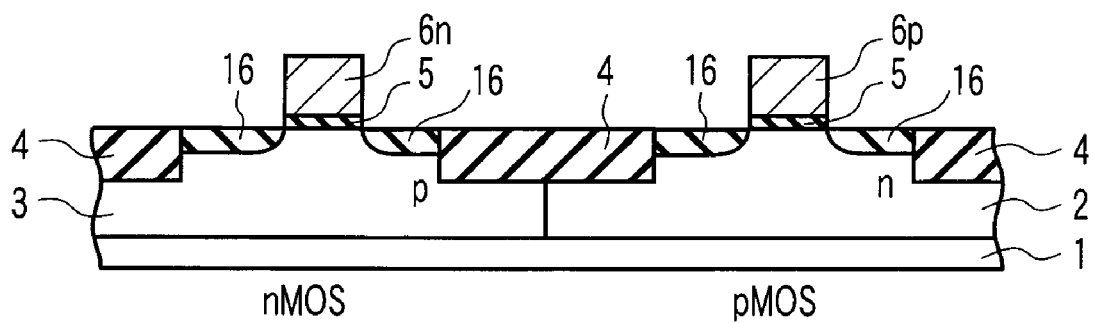
FIG. 10 is a cross-sectional view showing the method for manufacturing the CMOSFET of the embodiment following FIG. 9.
Figure 11:
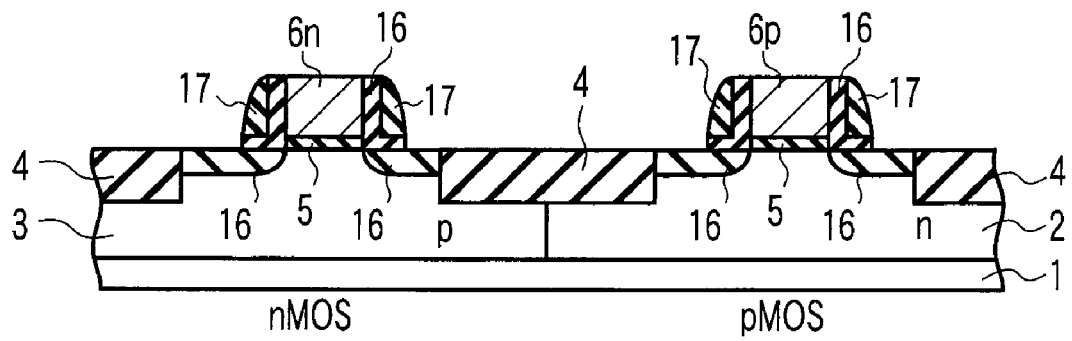
FIG. 11 is a cross-sectional view showing the method for manufacturing the CMOSFET of the embodiment following FIG. 10.
Figure 12:
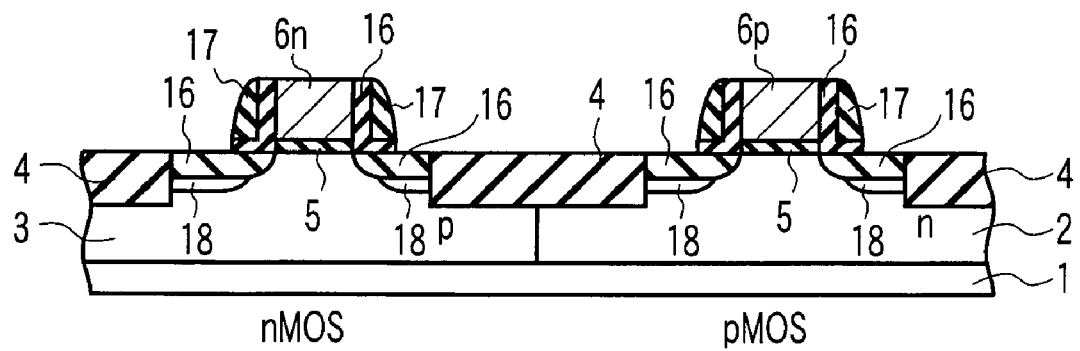
FIG. 12 is a cross-sectional view showing the method for manufacturing the CMOSFET of the embodiment following FIG. 11.

FIG. 9 shows a step for processing the polycrystalline silicon film 6 to form gate electrodes 6n and 6p. FIG. 10 shows a step for forming extensions 16. FIG. 11 shows a step for sequentially forming first spacers 16 (e.g., silicon oxide films) and second spacers 17 (e.g., silicon nitride films), and FIG. 12 shows a step for forming source/drain regions 18.

According to the embodiment, since the width of the n-type and p-type impurity region 15 is 10 nm or less, the threshold voltage of the fine CMOSFET can be easily controlled. Hereafter, this point will be further explained.

FIG. 13 shows the result of investigation of relationship between a shift of threshold voltage Vth of the CMOSFET manufactured by using the conventional method (FIGS. 16 to 19) and a separation width of pMOSFET and nMOSFET. The separation width is varied from 10 to 100 nm.

As shown in FIG. 13, when the separation width of the nMOSFET and pMOSFET is varied from 10 to 100 nm, the shift of the threshold voltage Vth of the nMOSFET is largely increased if the separation width of the nMOSFET and pMOSFET becomes 60 nm or less, and the threshold voltage Vth shift of the pMOSFET is increased largely if the separation width of the nMOSFET and pMOSFET becomes 50 nm or less.

The reason why the increase in the threshold voltage Vth shift of the nMOSFET becomes significant at a greater separation width than the increase in the threshold voltage Vth shift of the pMOSFET is that the diffusion of the p-type impurities (e.g., B ions) is faster than diffusion of the n-type impurities, so that the p-type impurities in the pMOS forming region reach a gate region of nMOSFET in the nMOS forming region soon, and this varies the threshold voltage.

FIG. 14 shows the result of investigation of relationship between the shift of the threshold voltage Vth of the CMOSFET manufactured by using the method of the embodiment and the separation width of the pMOSFET and nMOSFET. The separation width is varied from 10 to 100 nm.

In the case of the present embodiment, as the overlap between the n-type impurity introduced region 9 and the p-type impurity introduced region 13 (n-type and p-type impurity introduced region 15) is suppressed to 10 nm or less, so that as shown in FIG. 14, up to about 10 nm of the separation width of the nMOSFET and pMOSFET, the increasing of shift of the threshold voltage Vth is hardly found for each of the nMOSFET and pMOSFET, and the threshold voltage Vth shift value is 5 mV or less.

From the mentioned above, according to the present embodiment, it is confirmed that the Vth control ability is improved, and CMOS-LSI could be finer to smaller size.

In the actual LSI, a metal film (e.g., an Ni(90%)-Pt(10%) alloy film, an Ni(90%)-Pd(10%) alloy film, a Pd film or the like) including at least one of Ni, Co, Pd, Pt, Ir and the like is formed on the surface of the polycrystalline silicon film 6 is formed, thereafter, the heating treatment is carried out, thereby a portion or all of the polycrystalline silicon film 6 is changed into metal silicide. Even in this case, it is confirmed that a good Vth control ability is obtained.

In addition, even if polycrystalline SiGe, amorphous Si or amorphous SiGe is used instead of the polycrystalline silicon film 6, it is confirmed that the Vth control ability is also improved.

In addition, according to the present embodiment, since the silicon oxide film 10 as a mask is formed in the self alignment manner, it is unnecessary to use an exposure apparatus having high alignment precision. Thus, cost is not increased in a production stage of the device.

Further, according to the present embodiment, the width of the n-type and p-type impurity region 15 can be narrowed without increasing the CAD correction work, so that the present embodiment is easily applied to small lot production of many products.

Another method embodiment will be explained using FIGS. 20 to 26. Here, the explanation is given for extension of source/drain.

[FIG. 20]

A polymer including carbon as a main component (carbon polymer) 202 is formed on a silicon substrate 201. The thickness of the carbon polymer 202 is 100 nm-200 nm. A SOG film 203 having thickness of 50 nm is formed on the carbon polymer 202. A resist pattern 204 is formed on the SOG film 203. The resist pattern 204 covers the region except the nMOS forming region. The thickness of the resist pattern 204 is 500 nm-600 nm.

[FIG. 21]

The SOG film 203 is etched by RIE (Reactive Ion Etching) process using the resist pattern 204 as a mask. At this time, since the resist pattern 204 is thick (500 nm-600 nm), the edge of resist pattern 204 is rendered to have volume shrinkage. As a result, after the etching of the SOG film 203, the edge of resist pattern 204 is rendered to have a taper shape. The edge of SOG film 203 has a vertical shape.

[FIG. 22]

The surface of the silicon substrate 201 in the nMOS forming region is exposed by etching the carbon polymer 202 using the resist pattern 204 and the SOG film 203 as a mask. The resist pattern 204 vanishes in the middle of etching the carbon polymer 202, thereafter the carbon polymer 202 is etched using the SOG film 203 as a mask. The carbon polymer 202 is processed to have a vertical edge since the SOG film 203 has the vertical edge.

[FIG. 23]

The SOG film 203 is removed, thereafter phosphorus ions or phosphorus radicals 205 are irradiated into silicon substrate, thereby a phosphorus introduced region 206 having 5 nm or less depth is formed on a surface of silicon substrate 201 in nMOS forming region. The phosphorus ions or phosphorus radicals 205 are obtained by generating plasma using $PH_3$ gas diluted by He or $PF_3$ gas diluted by He.

[FIG. 24]

The carbon polymer 202 is removed by ashing using oxygen radicals. At this time, the exposed surface of the silicon substrate 201 is oxidized by the oxygen radicals. As a result, silicon oxide film 207 having thickness of 3-4 nm is formed on the phosphorus introduced region 206 (silicon region), and silicon oxide film 208 having thickness of 0.5-1 nm is formed on the PMOS forming region (silicon region). Since the phosphorus introduced region 206 is exposed to the oxygen radicals for longer time than the pMOS forming region, the silicon oxide film 207 is formed thicker than the silicon oxide film 208.

[FIG. 25]

Boron ions or boron radicals having 1 keV or less energy are irradiate into the silicon substrate 201, thereby a boron introduced region 210 having 5 nm or less depth is formed on a surface of the silicon substrate 201 in the pMOS forming region.

Figure 27:
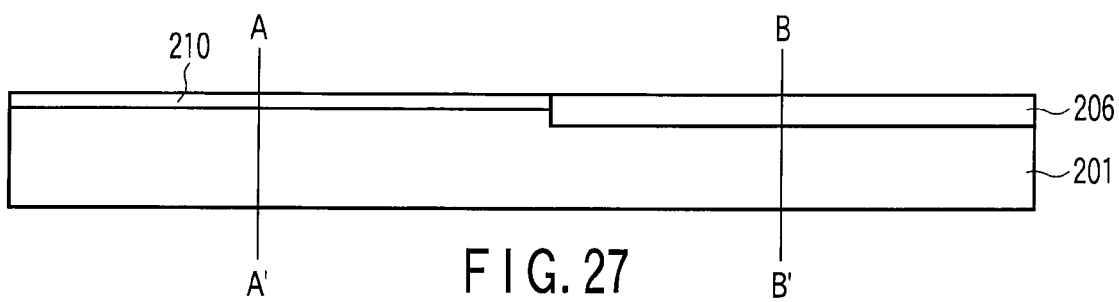
FIG. 27 is a view for explaining cross sections of portions having the impurity concentration profiles of FIGS. 26A and 26B.

FIGS. 26A and 26B respectively shows the result of investigation of impurity concentration profiles in A-A' depth direction and B-B' depth direction of the structure in which the silicon oxide films 207 and 208 are removed as shown in FIGS. 27A and 27B FIG. 26A shows boron concentration profile in the A-A' cross section corresponding to the extension of source/drain in the pMOS forming region. From FIG. 26A, it is seen that a region having boron concentration of $5 \times 10^{18}$ $cm^{-3}$ or higher is a region within 4 nm or less depth from the surface of pMOS forming region.

FIG. 26B shows boron concentration profile in the B-B' cross section corresponding to the extension of source/drain in the nMOS forming region. From FIG. 26B, it is seen that a silicon oxide film is a region within 3.5 nm or less depth from the surface of nMOS forming region and this region has boron concentration lower than measuring limit.

Figure 24:
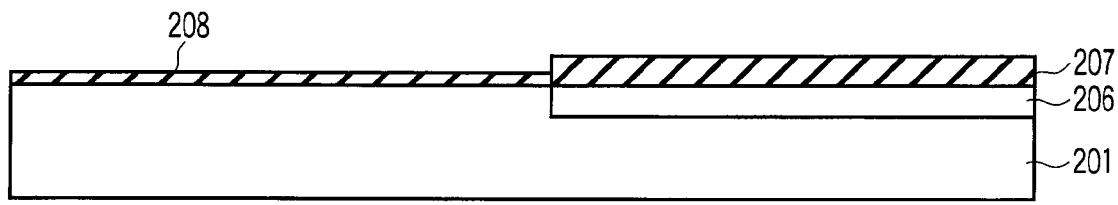
FIG. 24 is a cross-sectional view showing the manufacturing method of the another embodiment following FIG. 23.
Figure 25:
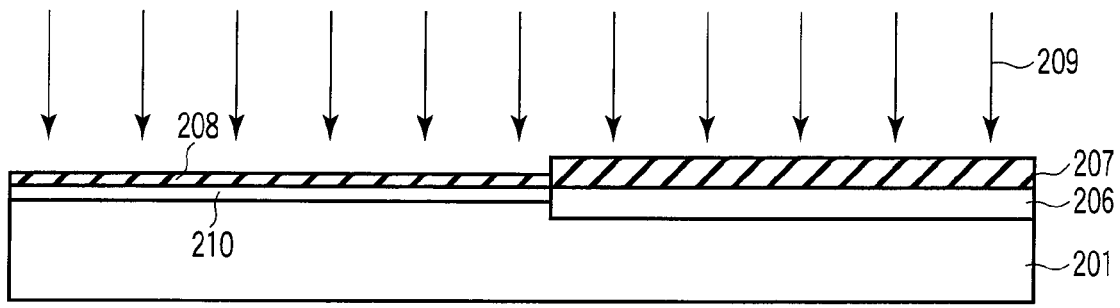
FIG. 25 is a cross-sectional view showing the manufacturing method of the another embodiment following FIG. 24.

This silicon oxide film having thickness of 3.5 nm is formed at the time of removing the carbon polymer 202 in the pMOS forming region by ashing using oxygen radicals in the step of FIG. 24, the Si surface layer of half the thickness of this is oxidized.

In addition, FIG. 26B shows that a phosphorus introduced region having concentration of $5 \times 10^{18}$ $cm^{-3}$ or higher and thickness less than about 4 nm is formed beneath the silicon oxide film having thickness of 3.5 nm, the phosphorus introduced region having thickness less than about 4 nm is formed in the extension region of nMOS transistor.

En passant, as the boron ions or boron radicals 209 irradiated in the step of FIG. 26B are distributed deeper than the silicon oxide film of 3.5 nm by 0.5 nm, the boron profile shows the boron distributed in Si, however it is confirmed that no electrical problem occurs since the difference between the phosphorus concentration and the boron concentration is $1 \times 10^{20}$ $cm^{-3}$ or higher.

In the present embodiment, the carbon polymer 202 is used as the mask for the pMOS forming region, other films may be used. For example, a polyimide film, a silicon oxide film, or a silicon nitride film may be used as the mask. When the silicon oxide film, or the silicon nitride film is used as the mask, the mask can be removed by plasma ashing. This plasma ashing is performed by plasma generated by using a mixture gas of oxygen and other gas (for example, at least one of hydrogen, HF, $F_2$, $CF_4$, $SF_6$ and $NF_3$).

The present invention is not limited to the above mentioned embodiments.

For example, in the above mentioned embodiments, the n-type impurity region 11 is formed before forming the p-type impurity region 14, but the p-type impurity region 14 may be formed before forming the n-type impurity region 11 on the contrary. In the case of this modification, the process needs some changes as follows. That is, in the step of FIG. 3, the p-type impurity introduced region is formed by the introduction of the p-type impurities in a state that the mask 7 is formed on the nMOS forming region, and in the step of FIG. 5, the silicon oxide film (mask) 10 is formed on the p-type impurity introduced region.

In addition, in the above mentioned embodiments, the n-type impurity region and the p-type impurity region are formed in the polycrystalline silicon film 6 (gate electrode), the present invention can also be applied to a case where n-type impurity region and the p-type impurity region (e.g., n-well and p-well) are formed on the surface of the silicon substrate.

Figure 2:
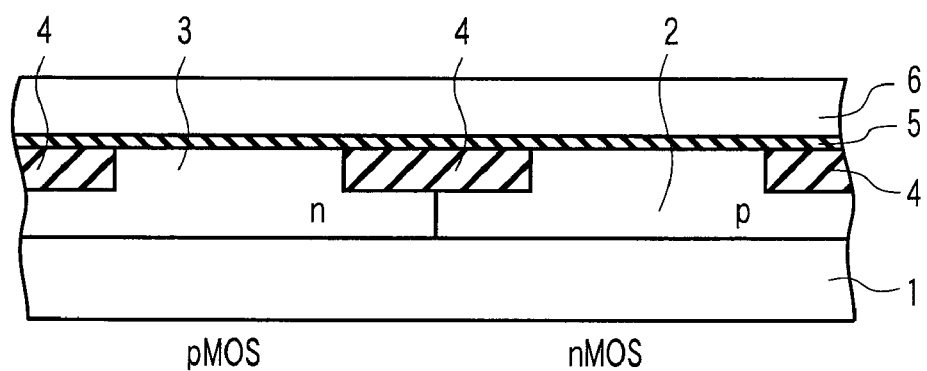
FIG. 2 is a cross-sectional view showing a method for manufacturing the CMOSFET of the embodiment.
Figure 3:
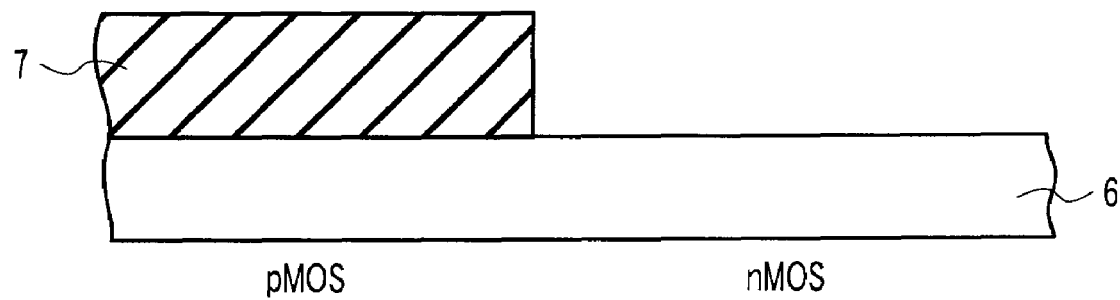
FIG. 3 is a cross-sectional view showing the method for manufacturing the CMOSFET of the embodiment following FIG. 2.
Figure 4:
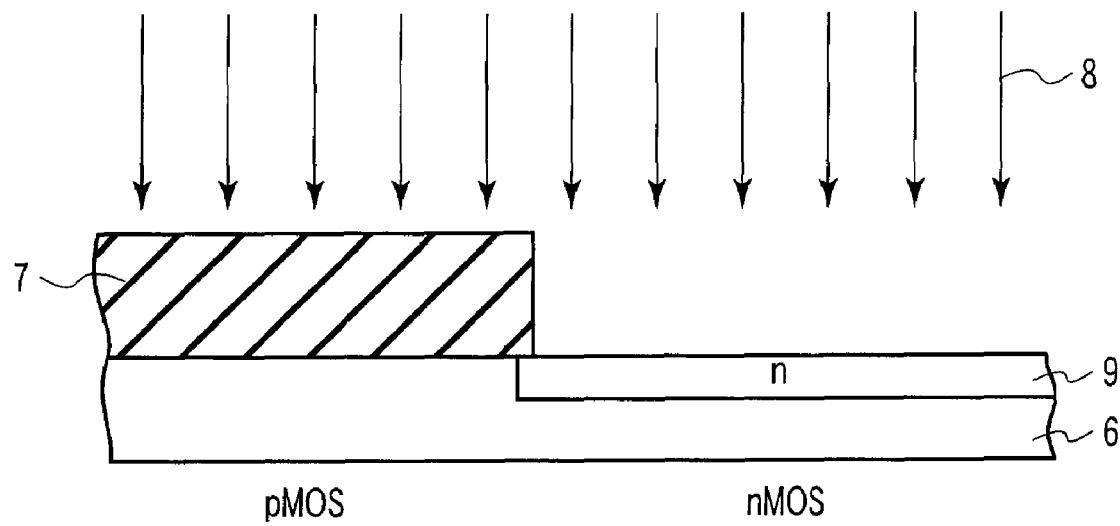
FIG. 4 is a cross-sectional view showing the method for manufacturing the CMOSFET of the embodiment following FIG. 3.
Figure 5:
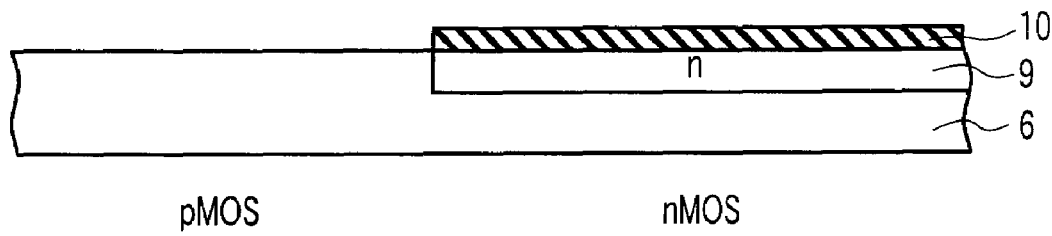
FIG. 5 is a cross-sectional view showing the method for manufacturing the CMOSFET of the embodiment following FIG. 4.
Figure 6:
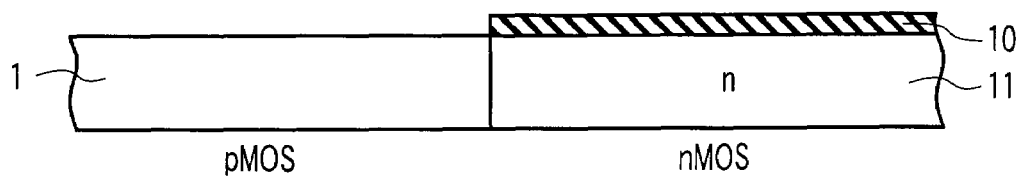
FIG. 6 is a cross-sectional view showing the method for manufacturing the CMOSFET of the embodiment following FIG. 5.
Figure 7:
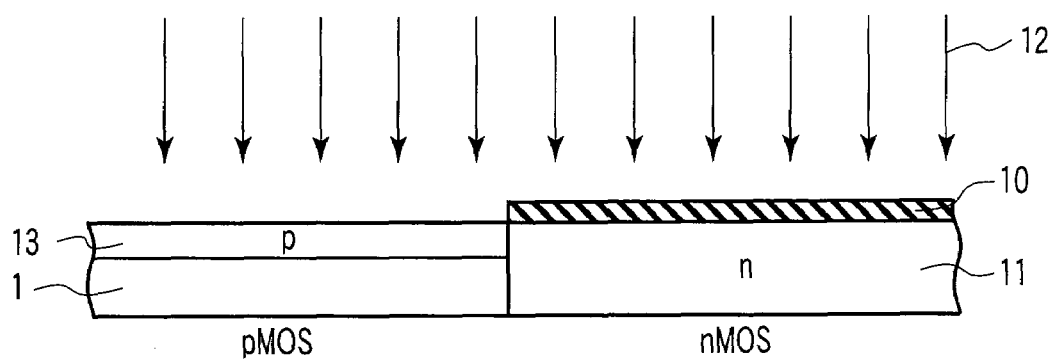
FIG. 7 is a cross-sectional view showing the method for manufacturing the CMOSFET of the embodiment following FIG. 6.
Figure 8:
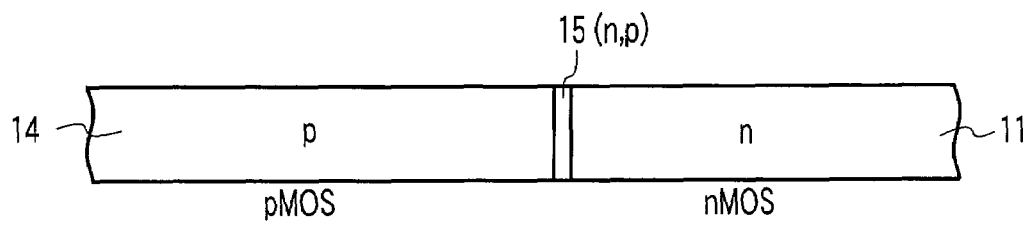
FIG. 8 is a cross-sectional view showing the method for manufacturing the CMOSFET of the embodiment following FIG. 7.
Figure 15:
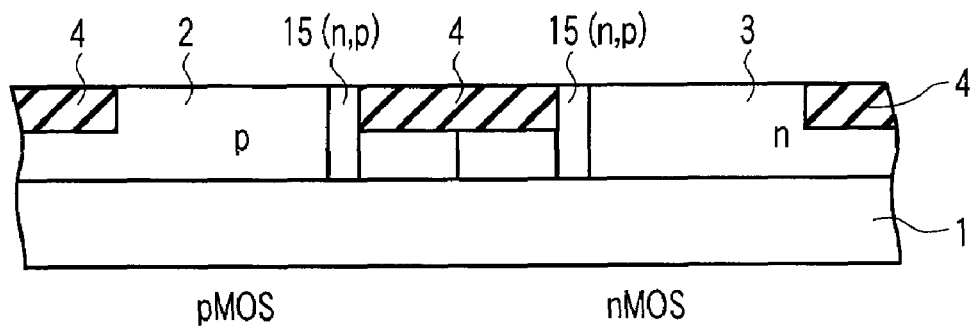
FIG. 15 is a cross-sectional view for explaining another embodiment.
Figure 16:
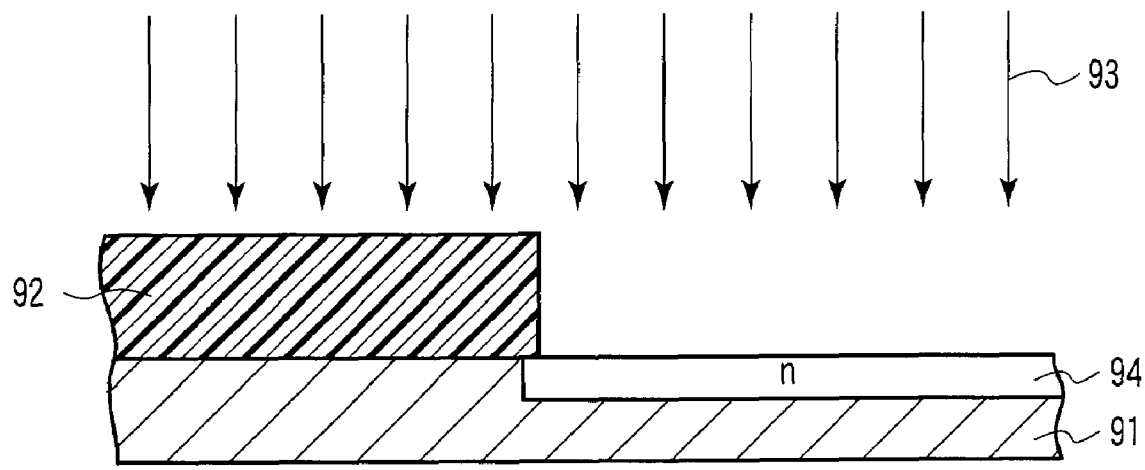
FIG. 16 is a cross-sectional view showing a gate process of a conventional CMOSFET.
Figure 17:
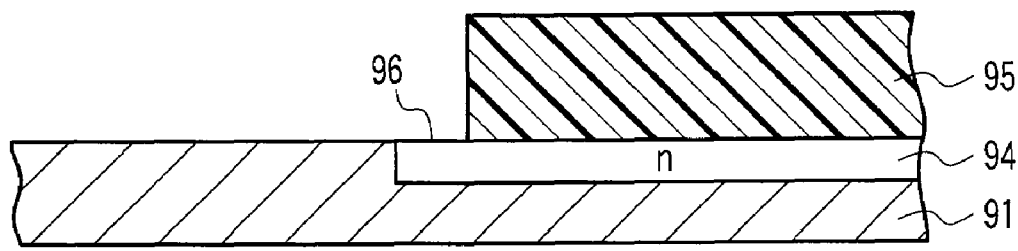
FIG. 17 is a cross-sectional view showing the gate process of the conventional CMOSFET following FIG. 16.
Figure 18:
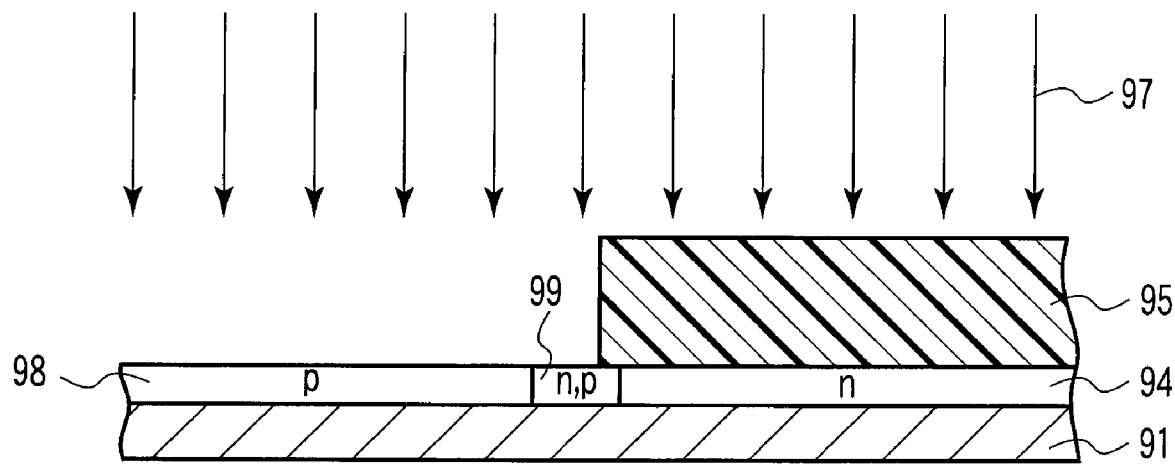
FIG. 18 is a cross-sectional view showing the gate process of the conventional CMOSFET following FIG. 17.
Figure 19:
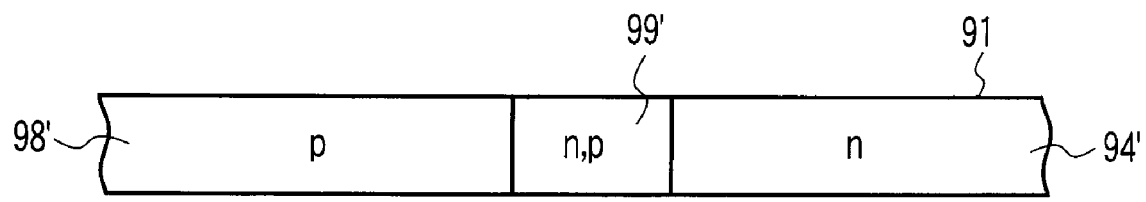
FIG. 19 is a cross-sectional view showing the gate process of the conventional CMOSFET following FIG. 18.
Figure 23:
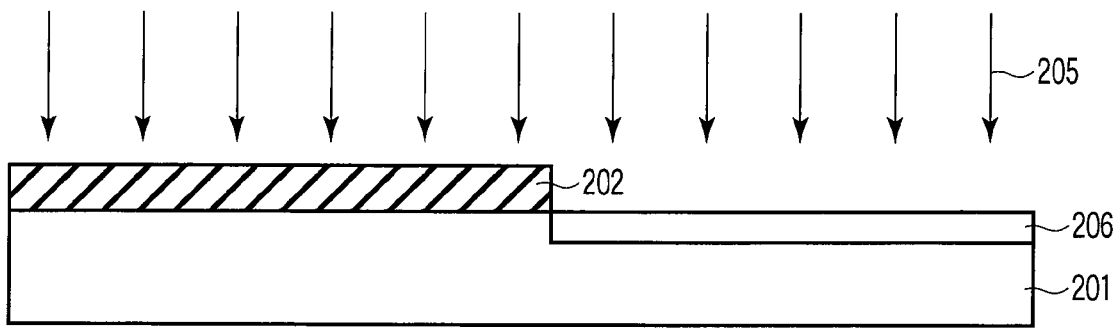
FIG. 23 is a cross-sectional view showing the manufacturing method of the another embodiment following FIG. 22.

When the present invention is applied to form the p-well 2 and the n-well 3 shown in FIG. 2, the width of the n-type and p-type impurity region 15 can be narrowed as shown in FIG. 15, wherein the n-type and p-type impurity region 15 is formed in a portion contacting the isolation region 4. Such an n-type and p-type impurity region 15 increases the contact resistance between the source/drain region and the source/drain electrode. Thus, it is preferable that the width of the n-type and p-type impurity region 15 is narrow. The contact resistance cannot be ignored in a fine generation where the width of the isolation region 3 is 30 nm or less, still more, 20 nm or less.

In addition, in the above mentioned embodiments, the n-type (first conductive type) impurities are introduced in the nMOS forming region (first region), thereafter the nMOS forming region (first region) is heated, the p-type (second conductive type) impurities are introduced in the pMOS forming region (second region), thereafter the pMOS forming region (second region) is heated, but both the nMOS forming region (first region) and the pMOS forming region (second region) may be heated after the introducing the n-type (first conductive type) impurities in the nMOS forming region (first region) followed by the introducing the p-type (second conductive type) impurities in the pMOS forming region (second region).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising a first conductive type impurity region formed by introducing a first conductive type impurities in a first region of a semiconductor region, and a second conductive type impurity region formed by introducing a second conductive type impurities in a second region of the semiconductor region, the method comprising:
   covering the second region with a mask and then introducing the first conductive type impurities in a surface of the first region;
   removing the mask by a process using gas including oxygen while forming an oxide film on the surface of the first region by the processing using the gas including the oxygen; and
   introducing the second conductive type impurities in a surface of the second region by using the oxide film as a mask.

2. The method according to claim 1, wherein the mask is a carbon film, a polyimide film, a silicon nitride film, or a silicon oxide film.

3. The method according to claim 1, wherein the second conductive type impurities are introduced in the surface of the second region with 1 keV or less energy.

4. The method according to claim 2, wherein the second conductive type impurities are introduced in the surface of the second region with 1 keV or less energy.

5. The method according to claim 1, wherein the process using the oxygen is oxygen plasma ashing.

6. The method according to claim 2, wherein the process using the oxygen is oxygen plasma ashing.

7. The method according to claim 3, wherein the process using the oxygen is oxygen plasma ashing.

8. The method according to claim 4, wherein the process using the oxygen is oxygen plasma ashing.

9. The method according to claim 1, wherein the first and second regions are nMOS and pMOS regions of a CMOS-FET.

10. The method according to claim 2, wherein the first and second regions are nMOS and pMOS regions of a CMOS-FET.

11. The method according to claim 3, wherein the first and second regions are nMOS and pMOS regions of a CMOS-FET.

12. The method according to claim 4, wherein the first and second regions are nMOS and PMOS regions of a CMOS-FET.

13. The method according to claim 5, wherein the first and second regions are nMOS and pMOS regions of a CMOS-FET.

14. The method according to claim 6, wherein the first and second regions are nMOS and pMOS regions of a CMOS-FET.

15. The method according to claim 7, wherein the first and second regions are nMOS and pMOS regions of a CMOS-FET.

16. The method according to claim 8, wherein the first and second regions are nMOS and pMOS regions of a CMOS-FET.

17. The method according to claim 1, further comprising heating the first region after the introducing the first conductive type impurities in the first region, and heating the second region after the introducing the second conductive type impurities in the second region.

18. The method according to claim 1, wherein the introducing the second conductive type impurities in the second region is carried out after the introducing the first conductive type impurities in the first region and without heating the first region, and further comprising heating the first and second regions after the introducing the first and second conductive type impurities respectively in the first and second regions.

* * * * *

UNITED STATES PATENT AND TRADEMARK OFFICE
CERTIFICATE OF CORRECTION

PATENT NO. : 7,709,363 B2 Page 1 of 1
APPLICATION NO. : 12/125497
DATED : May 4, 2010
INVENTOR(S) : Suguro It is certified that error appears in the above-identified patent and that said Letters Patent is hereby corrected as shown below:

* Title page, Item (57), in the Abstract, line 3, change "a first conductive" to --first conductive--.

* Title page, Item (57), in the Abstract, line 5, change "introducing a" to --introducing--.

* Claim 1, column 9, line 37, change "introducing a" to --introducing--.

* Claim 1, column 9, line 39, change "introducing a" to --introducing--.

* Claim 12, column 10, line 26, change "PMOS" to --pMOS--.

Signed and Sealed this

Twenty-second Day of June, 2010

David J. Kappos
*Director of the United States Patent and Trademark Office*